(12) United States Patent
Garcia et al.

(10) Patent No.: US 8,686,742 B2
(45) Date of Patent: Apr. 1, 2014

(54) METHOD AND SYSTEM FOR TESTING WIND TURBINE PLANTS

(75) Inventors: Jorge Martinez Garcia, Risskov (DK); Philip Carne Kjaer, Århus C (DK); Peter Nielsen, Fredericia (DK)

(73) Assignee: Vestas Wind Systems A/S, Aarhus N. (DK)

( * ) Notice: Subject to any disclaimer, the term of this patent is extended or adjusted under 35 U.S.C. 154(b) by 523 days.

(21) Appl. No.: 12/934,526

(22) PCT Filed: Dec. 16, 2009

(86) PCT No.: PCT/EP2009/067272
§ 371 (c)(1),
(2), (4) Date: Dec. 16, 2010

(87) PCT Pub. No.: WO2010/069989
PCT Pub. Date: Jun. 24, 2010

(65) Prior Publication Data
US 2011/0260739 A1    Oct. 27, 2011

Related U.S. Application Data

(60) Provisional application No. 61/138,271, filed on Dec. 17, 2008.

(30) Foreign Application Priority Data

Dec. 17, 2008  (DK) .................. 2008 01803

(51) Int. Cl.
*G01R 27/28* (2006.01)
*F03D 9/00* (2006.01)

(52) U.S. Cl.
USPC .......................................... 324/652; 290/44

(58) Field of Classification Search
USPC ........................................................ 324/652
See application file for complete search history.

(56) References Cited

U.S. PATENT DOCUMENTS

| | | | |
|---|---|---|---|
| 5,642,005 A * | 6/1997 | Pelletier et al. .................. | 307/87 |
| 6,130,645 A * | 10/2000 | Lindenmeier et al. ......... | 343/704 |
| 7,463,106 B2 * | 12/2008 | Shin et al. ..................... | 331/167 |
| 8,026,692 B2 * | 9/2011 | Chang ........................... | 320/101 |
| 2004/0035365 A1* | 2/2004 | Yamazawa et al. ....... | 118/723 E |
| 2005/0146224 A1 | 7/2005 | Liu et al. | |
| 2009/0079191 A1* | 3/2009 | Mari et al. ...................... | 290/43 |
| 2011/0130889 A1* | 6/2011 | Khajehoddin et al. ......... | 700/298 |
| 2012/0038167 A1* | 2/2012 | Kjaer et al. ..................... | 290/55 |

FOREIGN PATENT DOCUMENTS

| | | |
|---|---|---|
| EP | 1 801 414 | 12/2006 |
| EP | 1 764 894 | 3/2007 |
| EP | 1 764 894 A1 | 3/2007 |
| JP | 3-56009 | 3/1991 |
| JP | 3-56099 | 3/1997 |
| WO | 2006/022576 A1 | 3/2006 |
| WO | WO 2006/022576 | 3/2006 |
| WO | 2007/132157 A2 | 11/2007 |
| WO | WO 2007/132157 | 11/2007 |

* cited by examiner

*Primary Examiner* — Jeff Natalini
(74) *Attorney, Agent, or Firm* — Patterson & Sheridan, LLP

(57) ABSTRACT

The present invention relates to a method and a system for on-site and full-scale testing of wind turbine plants. In particular, the present invention relates to a method and a system applying resonance circuits tuned with the fundamental frequency, or harmonics thereof, of a power supply grid connected to a wind turbine plant to be tested. The wind turbine plant to be tested may remain connected to the power supply grid during on-site and full-scale testing.

21 Claims, 1 Drawing Sheet

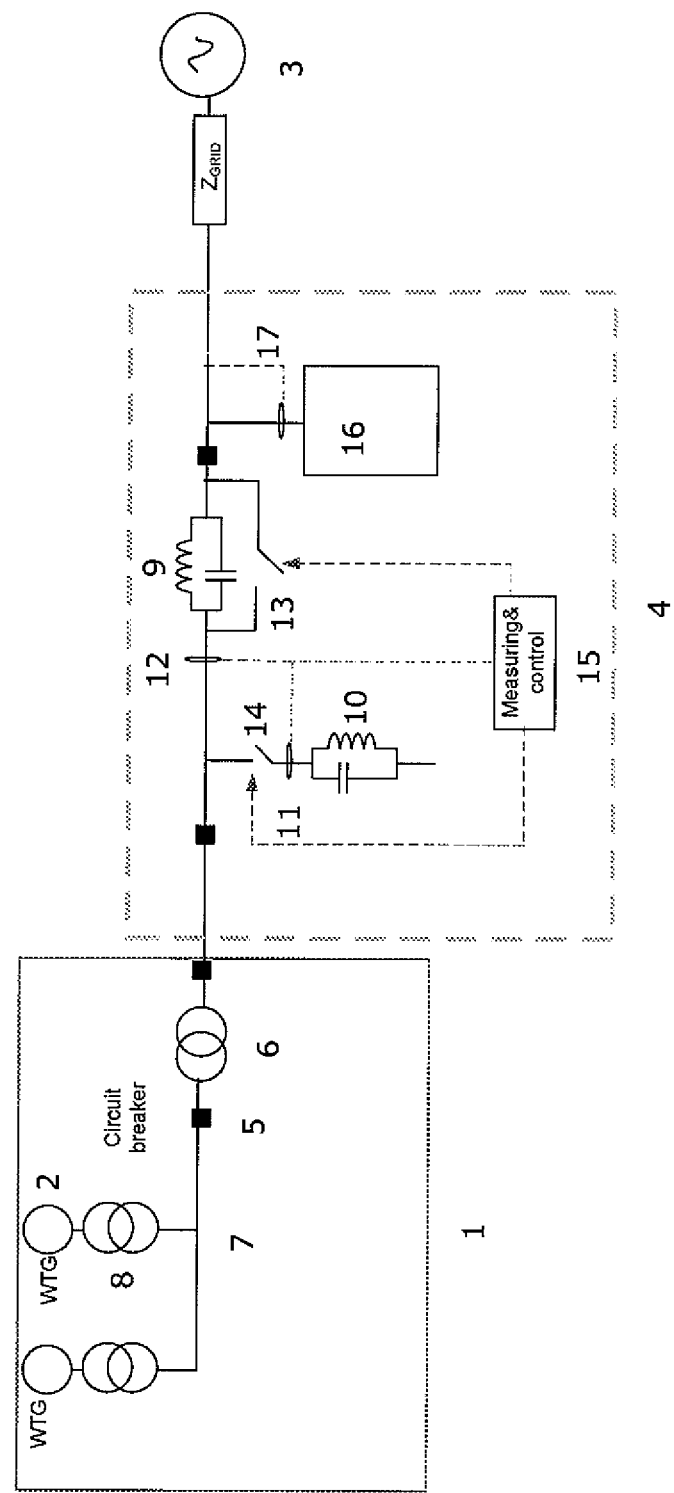

METHOD AND SYSTEM FOR TESTING WIND TURBINE PLANTS

PRIORITY CLAIM

This is a U.S. national stage of application No. PCT/EP2009/067272, filed on Dec. 16, 2009. Priority is claimed on the following applications: Denmark Application No. PA 2008 01803 filed on Dec. 17, 2008 and U.S. Application No. 61/138,271 filed on Dec. 17, 2008, the content of which are incorporated here by reference.

FIELD OF THE INVENTION

The present invention relates to a method and a system for testing a wind turbine facility, preferably a wind turbine plant. In particular, the present invention relates to a method and a system applying resonance circuits tuned with the fundamental frequency, or harmonics thereof, of a power supply grid connected to the wind turbine facility to be tested.

BACKGROUND OF THE INVENTION

Test systems of today for on-site and full-scale testing of wind turbines for voltage ride through performance are rather bulky. In fact it requires test equipment taking up a complete container in order to perform a realistic full-scale test of a single wind turbine. Moreover, known systems, such as the system suggested in EP 1 801 414, require that a wind turbine to be tested is disconnected from an associated power supply grid during testing.

In order to test a complete wind turbine plant an equivalent of one test container is required for each wind turbine in the plant. Obviously, on-site testing of wind turbine plants using conventional systems and methods become unrealistic.

For the above reasons it may be seen as an object of embodiments of the present invention to provide a method and a test system capable of testing wind turbine plants under realistic conditions.

It may be seen as a further object of embodiments of the present invention to provide a method and a test system for testing wind turbine plants, said method and test system being capable of performing on-site and full-scale tests of wind turbine plants without disturbing the power supply grid, including the customers connected thereto.

It may be seen as a still further object of embodiments of the present invention to provide a mobile test system for wind turbine plants.

DESCRIPTION OF THE INVENTION

The above-mentioned objects are complied with by providing, in a first aspect, a mobile test system for on-site testing of a wind turbine facility operatively connected to a power supply grid, the test system comprising a first resonance circuit having a variable impedance at the fundamental frequency of the power supply grid, the first resonance circuit being adapted to be inserted in series with the wind turbine facility and the power supply grid.

The inventors have realized that in order to test a complete wind turbine plant using known techniques an equivalent of one test container is required for each wind turbine in the plant. The proposed mobile test system will enable on-site and full-scale testing of wind turbine plants with a highly reduced amount of equipment.

The term "wind turbine facility" should be understood broadly. Thus, the term wind turbine facility may cover any facility that converts wind power to electrical power. Examples of such facilities are isolated wind turbines, small groups of wind turbines, wind turbine plants or sub-groups thereof.

The term "mobile" should be understood as a system being adapted to be moved from one wind site to another wind site. Thus, the test system according to the first aspect of the present invention may be easily moved between plant sites in order to test wind turbine plants positioned on different locations.

The first resonance circuit may be adapted to be inserted between a point of common coupling and the power supply grid. In this way, a series connection comprising the wind power facility, the first resonance circuit and power supply grid is established. The first resonance circuit may be constituted by a single resonance circuit, or it may be constituted by a plurality of resonance circuits being coupled in parallel, wherein each of said plurality of resonance circuits is tuned to match a selected harmonics.

The test system may further comprise a second resonance circuit having a variable impedance at the fundamental frequency of the power supply grid, the second resonance circuit being adapted to be inserted between the point of common coupling and ground.

The first and second impedances are variable in such a manner that a predetermined short circuit current level is obtainable. Also, the voltage level at the point of common coupling may be varied between 0 and a level exceeding its nominal value by varying a ratio between the impedances of the first and second resonance circuits. The reason for this being that the first and second resonance circuits form a voltage divider in combination.

The impedances of the first and second resonance circuits may in principle be as high or low as desired. However, the first resonance circuit is typically adapted to be tuned to have an impedance lower than the impedance of the second resonance circuit at the fundamental frequency of the power supply grid.

Preferably, the impedance in series with the grid, i.e. the first resonance circuit, leaves the short circuit ratio (SCR) at a maximum of five. Thus, the ratio between the impedances of the second and first resonance circuits is preferably smaller than five. The impedance of the second resonance circuit defines the voltage level remaining at the point of common coupling.

Circuit breakers may be provided for each of the first and second resonance circuits in order to activate and/or deactivate the first and/or second resonance circuits. The circuit breaker or breakers provided for activating and/or deactivating the first resonance circuit is/are provided in parallel wherewith. In this way the first resonance circuit may be short-circuited and thereby by-passed in case demand so required. In case the first resonance circuit is constituted by a plurality of resonance circuits coupled in parallel a circuit breaker may be provided for each of the resonance circuits so that each individual resonance circuit may be activated and/or deactivated. Alternatively, a common circuit breaker for activating and/or deactivating the first resonance circuit as a whole may be provided. In terms of implementation the circuit breakers may be constituted by controllable electrical switches.

Regarding the second resonance circuit a circuit breaker may be provided in series therewith.

Measuring devices may be provided for each of the first and second resonance circuits. Each of said measuring devices may be adapted to measure an electrical parameter, such as a voltage, a current, a frequency etc. In this way voltages, currents etc. provided to the respective resonance circuits may be monitored.

In order to control the test system, control means adapted for signal processing of measured parameters, and for controlling circuit breakers may be provided.

The test system may further comprise compensation means, such as a STATCOM or a synchronous compensator. These optional compensation means may be used to compensate for unwanted disturbances of the grid voltage caused by switching of the impedances. Suppressions of unwanted disturbances are important in that they, otherwise, will reach and disturb consumers and/or other wind turbine generators operatively connected to the grid.

In a second aspect, the present invention relates to a method for on-site testing of a wind turbine facility operatively connected to a power supply grid, the method comprising the step of providing, between a point of common coupling and the power supply grid, a first resonance circuit having a variable impedance at a fundamental frequency of the power supply grid.

Again, the term wind turbine facility should be understood broadly. Thus, the term wind turbine facility may cover any facility that converts wind power to electrical power. Examples of such facilities are isolated wind turbines, small groups of wind turbines, wind turbine plants or sub-groups thereof.

The method may further comprise the step of providing a second resonance circuit having variable impedance at the fundamental frequency of the power supply grid, the second resonance circuit being provided between the point of common coupling and ground.

The first resonance circuit may be adapted to be inserted between a point of common coupling and the power supply grid. In this way, a series connection comprising the wind power facility, the first resonance circuit and power supply grid is established. The first resonance circuit may be constituted by a single resonance circuit, or it may be constituted by a plurality of resonance circuits being coupled in parallel, wherein each of said plurality of resonance circuits is tuned to match a selected harmonics.

The first and second impedances are variable in such a manner that a predetermined short circuit current level is obtainable if the first and second impedances are selected appropriately. The terms of values the first and second impedances may be selected within the ranges mentioned in connection with the first aspect of the present invention.

As previously mentioned, the voltage level at the point of common coupling may be varied between 0 and a level exceeding its nominal value by varying a ratio between the impedances of the first and second resonance circuits.

In order carry out the method according to the second aspect of the present invention one or more electrical parameters, such as a voltage, a current, a frequency etc, may be measured, and subsequently used as input parameters to a control system controlling a number of circuit breakers adapted to activate and/or deactivate resonance circuits.

BRIEF DESCRIPTION OF THE INVENTION

The present invention will now be explained in further details with reference to the accompanying drawing.

While the invention is susceptible to various modifications and alternative forms, a specific embodiment has been shown by way of example in the drawing and will be described in detail herein. It should be understood, however, that the invention is not intended to be limited to the particular form disclosed. Rather, the invention is to cover all modifications, equivalents, and alternatives falling within the spirit and scope of the invention as defined by the appended claims.

DETAILED DESCRIPTION OF THE INVENTION

In its broadest aspect the present invention relates to a mobile test system, and an associated method, suitable for on-site and full-scale testing of wind turbine plants under realistic working conditions. The system, and associated method, according to the present invention aims at performing tests on wind turbine plants without disturbing the power supply grid operatively connected to the wind power plant. The principle underlying the present invention relies on the appliance of resonance circuits being tuned so as to match the fundamental frequency, or harmonics thereof, of the power supply grid.

The test system and the associated method of the present invention facilitate that wind power plant characteristics such as for example voltage control for various short circuit ratios can be determined. Moreover, characteristics relating to low voltage ride through situations can be mapped. Also, islanding behaviour and harmonic disturbances can be tested. For example, if the impedance to ground is constituted by a resistive load, frequency voltage for islanding operation can be analysed.

Referring now to FIG. 1 the system according to one embodiment of the present invention is depicted. As depicted in FIG. 1 a wind turbine plant 1 comprising a plurality of wind turbines 2 is operatively connected to a power supply grid 3 having a grid impedance $Z_{grid}$ via the test system 4 according to an embodiment of the present invention. The wind turbine plant 1 typically comprises a circuit breaker 5 and a grid transformer 6 for matching the voltage level of the plant to the voltage level of the grid. Moreover, each of the wind turbines 2 may optionally be coupled to a plant grid 7 via a transformer 8.

The test system depicted in FIG. 1 comprises a first resonance circuit 9 and a second resonance circuit 10. In FIG. 1 the first resonance circuit 9 is inserted between a point of common coupling and the power supply grid 3. In this way, a series connection comprising the wind power plant, the first resonance circuit and power supply grid is established.

In FIG. 1 the first resonance circuit 9 is constituted by a single resonance circuit. However, the first resonance circuit 9 may, alternatively, be constituted by a plurality of resonance circuits being coupled in parallel, wherein each of said plurality of resonance circuits is tuned to match a selected harmonics of the fundamental frequency of the power supply grid. A selected harmonics fulfils the expression 6n±1, where n is a positive integer. Thus, in the lower end of the harmonic spectra typical grid harmonics are the $5^{th}$, $7^{th}$, $11^{th}$ and $13^{th}$.

Each resonance circuit of the test system comprises a capacitor and an inductor coupled in parallel or in series. Moreover, resistors for damping purposes may be provided.

In order to determine the design values of the first and second resonance circuits the following system of three equations with three unknowns (L, C and R) need to be solved:

$$\omega_r = \sqrt{\frac{1}{LC}}$$

$$Z = \frac{R}{2}$$

$$X_L = \pi \cdot f \cdot L$$

Where L and C are the inductance and the capacitance, respectively, and R is the internal resistance (not illustrated in FIG. 1) in both the inductive and capacitive branches of the filter. Moreover, Z denotes the impedance of the filter at resonance, $X_L$ is the impedance of the inductive branch whereas $\omega_r$ is the resonance frequency of the filter.

Appropriate sensor means 11, 12 are provided in connection with each of the resonance circuits 9, 10. These sensor means can be voltage and/or current sensors. Signals from the sensor means are processed by a measuring and controller module 15.

Moreover, controllable circuit breakers 13, 14 are provided for activating or deactivating the first 9 and second 10 resonance circuits, respectively. The measuring and control module 15 is arranged to control the circuit breakers 13, 14. In case the first resonance circuit 9 is to be activated, circuit breaker 13 needs to be closed. Similarly, in case the second resonance circuit 10 is to be activated, circuit breaker 14 needs to be open. In case only the second resonance circuit 10 is to be activated, circuit breakers 13 and 14 both need to be open.

The test system depicted in FIG. 1 is equipped with optional compensation means 16 in the form of for example a STATCOM or a synchronous compensator. Optional sensor means 17 may be provided in connection with the optional compensation means 16.

The test system depicted in FIG. 1 can be operated in various modes of operation. For example, if both circuit breakers 13, 14 are left open only the first resonance circuit is active. This mode of operation can be applied if the plant's response to various short circuit ratios is to be tested.

The invention claimed is:

1. A mobile test system for on-site testing of a wind turbine facility comprising at least one generator and operatively connected to a power grid to provide power thereto, the test system comprising:
   a first resonance circuit having a variable impedance at a fundamental frequency of the power grid,
   the first resonance circuit configured so that, when inserted in series with the wind turbine facility and the power grid, the first resonance circuit permits testing of the wind turbine facility while remaining operatively connected to the power grid.

2. The test system according to claim 1, wherein the first resonance circuit is adapted to be inserted between a point of common coupling of the wind turbine facility and the power grid.

3. The test system according to claim 2, further comprising a second resonance circuit having a variable impedance at the fundamental frequency of the power grid, the second resonance circuit being adapted to be inserted between the point of common coupling and ground.

4. The test system according to claim 3, wherein the first and second impedances are variable in such a manner that a predetermined short circuit current level is obtainable.

5. The test system according to claim 4, wherein the first resonance circuit is adapted to be tuned to have a lesser impedance than an impedance of the second resonance circuit at the fundamental frequency of the power grid.

6. The test system according to claim 5, wherein a ratio between the impedances of the second and first resonance circuits does not exceed five.

7. The test system according to claim 3, wherein a respective circuit breaker is provided for each of the first and second resonance circuits, each circuit breaker being adapted to at least one of activating and deactivating the respective resonance circuit.

8. The test system according to claim 3, wherein one or more measuring devices are provided for each of the first and second resonance circuits.

9. The test system according to claim 8, wherein each of the one or more measuring devices are adapted to measure an electrical parameter selected from a voltage, a current, and a frequency.

10. The test system according to claim 8, further comprising control means adapted for signal processing of measured parameters, and for controlling one or more circuit breakers respectively provided for one or more of the first and second resonance circuits.

11. The test system according to claim 1, further comprising compensation means.

12. The test system according to claim 11, wherein the compensation means comprises one of a STATCOM and a synchronous compensator.

13. The test system according to claim 1, wherein the first resonance circuit comprises a plurality of resonance circuits coupled in parallel, wherein each resonance circuit is tuned to match a respective selected harmonic.

14. A method for on-site testing of a wind turbine facility comprising at least one generator and operatively connected to a power grid to provide power thereto, the method comprising providing, in series between a point of common coupling of the wind turbine facility and the power grid, a first resonance circuit having a variable impedance at a fundamental frequency of the power grid.

15. The method according to claim 14, further comprising providing a second resonance circuit having a variable impedance at the fundamental frequency of the power grid, the second resonance circuit being provided between the point of common coupling and ground.

16. The method according to claim 15, further comprising selecting the first and second impedances to obtain a predetermined short circuit current level.

17. The method according to claim 15, wherein the impedance of the first resonance circuit at the fundamental frequency of the power grid is less than the impedance of the second resonance circuit at the fundamental frequency.

18. The method according to claim 15, wherein a ratio between the impedances of the second and first resonance circuits does not exceed five.

19. The method according to claim 15, further comprising selectively activating one or more of the first and the second resonance circuits using one or more circuit breakers, wherein each circuit breaker is arranged in parallel with a respective resonance circuit.

20. The method according to claim 14, further comprising measuring one or more electrical parameters comprising a voltage, a current, and a frequency.

21. A mobile test system for on-site testing of a wind turbine facility comprising at least one generator and operatively connected to a power grid to provide power thereto, the test system comprising:
   a first resonance circuit having a variable impedance at a fundamental frequency of the power grid,
   wherein the first resonance circuit is arranged in series between a point of common coupling of the wind turbine facility and the power grid.

* * * * *